(12) United States Patent
Kada et al.

(10) Patent No.: US 6,687,321 B1
(45) Date of Patent: Feb. 3, 2004

(54) DIGITAL PLL CIRCUIT

(75) Inventors: Kenichiro Kada, Yokohama (JP); Tomohiko Oota, Fuchu (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 582 days.

(21) Appl. No.: 09/665,681

(22) Filed: Sep. 20, 2000

(30) Foreign Application Priority Data

Sep. 24, 1999 (JP) .......................................... 11-271251

(51) Int. Cl.[7] ................................................ H03D 3/24
(52) U.S. Cl. .......................... 375/376; 331/57; 327/158
(58) Field of Search .......................... 375/376; 331/57, 331/187, 34; 327/158, 156

(56) References Cited

U.S. PATENT DOCUMENTS

| | | | |
|---|---|---|---|
| 5,126,691 A | * 6/1992 | Mijuskovic et al. | ........ 331/1 A |
| 5,490,182 A | * 2/1996 | Arai | ............. 375/376 |
| 5,847,617 A | * 12/1998 | Reddy et al. | ......... 331/57 |
| 5,861,780 A | * 1/1999 | Fukuda | .......... 331/57 |
| 6,310,928 B1 | * 10/2001 | Yunome | ....... 375/376 |

FOREIGN PATENT DOCUMENTS

| | | |
|---|---|---|
| JP | 8-237118 | 9/1996 |
| JP | 11-205131 | 7/1999 |

* cited by examiner

Primary Examiner—Temesghen Ghebretinsae
(74) Attorney, Agent, or Firm—Finnegan, Henderson, Farabow, Garrett & Dunner, L.L.P.

(57) ABSTRACT

A digital PLL circuit comprises a variable-frequency ring oscillator, a frequency divider for frequency-dividing the output signal of the ring oscillator, a phase comparator for comparing the frequency-divided output of the frequency divider with a phase reference signal, and a control signal generator for generating a control signal corresponding to the comparison output of the phase comparator and supplying the control signal to the ring oscillator. The ring oscillator includes delay circuits connected in a multistage manner, a multiplexer for selecting one of the output signals of the delay circuits connected in a multistage manner and determining the number of stages of delay circuits, an inverting delay circuit for inverting the output signal of the multiplexer, a variable capacitor so constructed that the value of its capacitance is changed by switching the number of unit capacitors connected, and a delay/capacitance controller for referring to correction information and controlling the selection of delay circuits by the multiplexer and the switching of the variable capacitor.

19 Claims, 3 Drawing Sheets

DIGITAL PLL CIRCUIT

CROSS-REFERENCE TO RELATED APPLICATIONS

This application is based upon and claims the benefit of priority from the prior Japanese Patent Application No. 11-271251, filed Sep. 24, 1999, the entire contents of which are incorporated herein by reference.

BACKGROUND OF THE INVENTION

This invention relates to a digital PLL (phase locked loop) circuit, and more particularly to a PLL circuit which uses a variable-frequency ring oscillator as a VCO (voltage controlled oscillator), the variable-frequency ring oscillator including a delay circuit including delay elements connected in a multi-stage and constructed so that the delay elements can be selected in number, and a variable capacitor connected to the delay circuit.

A conventional digital PLL circuit has used a variable-frequency ring oscillator. The variable-frequency ring oscillator is assembled by a multistage delay circuit, a multiplexer for determining the number of delay stages of the delay circuit, an inverter circuit for inverting the output signal of the multiplexer, an offset delay circuit for delaying the output signal of the inverter circuit for the length of input offset delay time and feeding back the delayed signal to the first stage of the delay circuit, and a variable capacitor connected to the first stage of the delay circuit and the ground. Two stages of inverters are connected to the output of the multiplexer. The output signal of the inverter at the latter stage is the output of the ring oscillator. There is further provided a delay/capacitance controller that generates a control signal for controlling the value capacitance of the variable capacitor (the number of capacitors connected in parallel) and the selection of the input to the multiplexer (the selection of the number of delay stages of the delay circuit).

In the delay-element-selection-type digital PLL circuit using the ring oscillator including two stages of inverters as a VCO, the output of the ring oscillator is frequency-divided by a frequency divider. A phase comparator compares the divided output with a phase reference signal, generates a control signal corresponding to the comparison output, and inputs the control signal to the delay/capacitance controller.

With the digital PLL circuit constructed as described above, the frequency of oscillation of the ring oscillator is roughly adjusted by the number of delay stages of the delay circuit and then finely adjusted by the value of capacitance of the variable capacitor (or the number of capacitors connected in parallel), thereby producing the desired output frequency.

Now, consider a case where the number of delay stages of the delay circuit and/or the number of unit capacitors connected in parallel are changed by the PLL operation according to the change of the frequency control input from the state where the ring oscillator is oscillating at the frequency determined by a specific number of delay stages of the delay circuit and/or a specific number of unit capacitors connected in parallel.

At this time, if only the number of unit capacitors connected were changed, the output frequency of the PLL circuit would result in only a change in the value of capacitance of the variable capacitor. Since only the change of the number of unit capacitors connected in parallel cannot produce the desired change of the frequency of oscillation, if the number of delay stages of the delay circuit were also changed, the PLL output frequency would change greatly due to variations in the delay characteristics of the delay circuit, causing jitters (fluctuations in the edge of the output signal) in the output frequency.

The change of the delay characteristic due to variations in the manufacture can be considered to be the cause of the occurrence of jitters in the output frequency. Namely, when variations in the manufacture result in variations in the amount of delay in one stage of the delay circuit or the amount of delay in a single unit capacitor, the following can be considered. The length of delay time in minimizing the value of capacitance of the variable capacitor when the number of delay stages of the delay circuit is increased by one is larger than the length of delay time in maximizing the value of capacitance of the variable capacitor. Moreover, when the number of delay stages of the delay circuit is changed, with the value of capacitance of the variable capacitor remaining unchanged, a variation in the length of delay time is too great, permitting jitters to occur in the PLL output frequency, which contributes to the deterioration of the PLL characteristic.

To avoid such a problem, an attempt is made to secure the continuity of the change of the length of delay time. For example, the delay circuit and variable capacitor are designed in advance to cause a certain number of delay stages of the delay circuit and its adjacent number of delay stages to have an overlap area where the length of delay time at one end of the delay time characteristic of the former overlaps with that at one end of the delay time characteristic of the latter. When the number of delay stages of the delay circuit is changed to the adjacent number of delay stages, the value of capacitance of the variable capacitor is changed to the value (other than the minimum and maximum values of capacitance) at which the length of delay time corresponding to the overlap area is obtained.

Such measures, however, cannot avoid variations in the delay characteristic due to variations in the manufacture. In a case where the amount of delay in one stage of the delay circuit or the amount of delay in a single unit capacitance varies, when the number of delay stages of the delay circuit has been changed, a variation in the length of delay time is too great, permitting jitters to occur, which contributes to the deterioration of the PLL characteristic.

As described above, a variable-frequency ring oscillator used as a VCO in a conventional digital PLL circuit has the following problem: when the number of delay stages of the delay circuit is changed and therefore the frequency is in transition, jitters occur in the PLL output frequency due to variations in the delay characteristic resulting from variations in the manufacture, which contributes to the deterioration of the PLL characteristic.

BRIEF SUMMARY OF THE INVENTION

The object of the present invention is to provide a digital PLL circuit capable of not only making desired corrections in the transition of frequency, even when there are variations in the delay characteristic due to variations in the manufacture of variable-frequency ring oscillators but also preventing the occurrence of jitters in the PLL output frequency and the deterioration of the PLL characteristic.

According to the present invention, there is provided a digital PLL circuit comprising a variable-frequency ring oscillator, a frequency divider for frequency-dividing the output signal of the ring oscillator, a phase comparator for comparing the frequency-divided output of the frequency divider with a phase reference signal, and a control signal generator for generating a control signal corresponding to the comparison output of the phase comparator and supplying the control signal to the ring oscillator, wherein the ring oscillator includes delay circuits connected in a multistage manner, a multiplexer for selecting one of the output signals of the delay circuits connected in a multistage manner and determining the number of stages of delay circuits, an inverting delay circuit for inverting the output signal of the multiplexer, a variable capacitor so constructed that the value of its capacitance is changed by switching the number of unit capacitors connected in parallel, and a delay/capacitance controller for referring to correction information and controlling the selection of delay circuits by the multiplexer and the switching of the variable capacitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, an embodiment of the present invention will be explained in detail.

Figure 1:
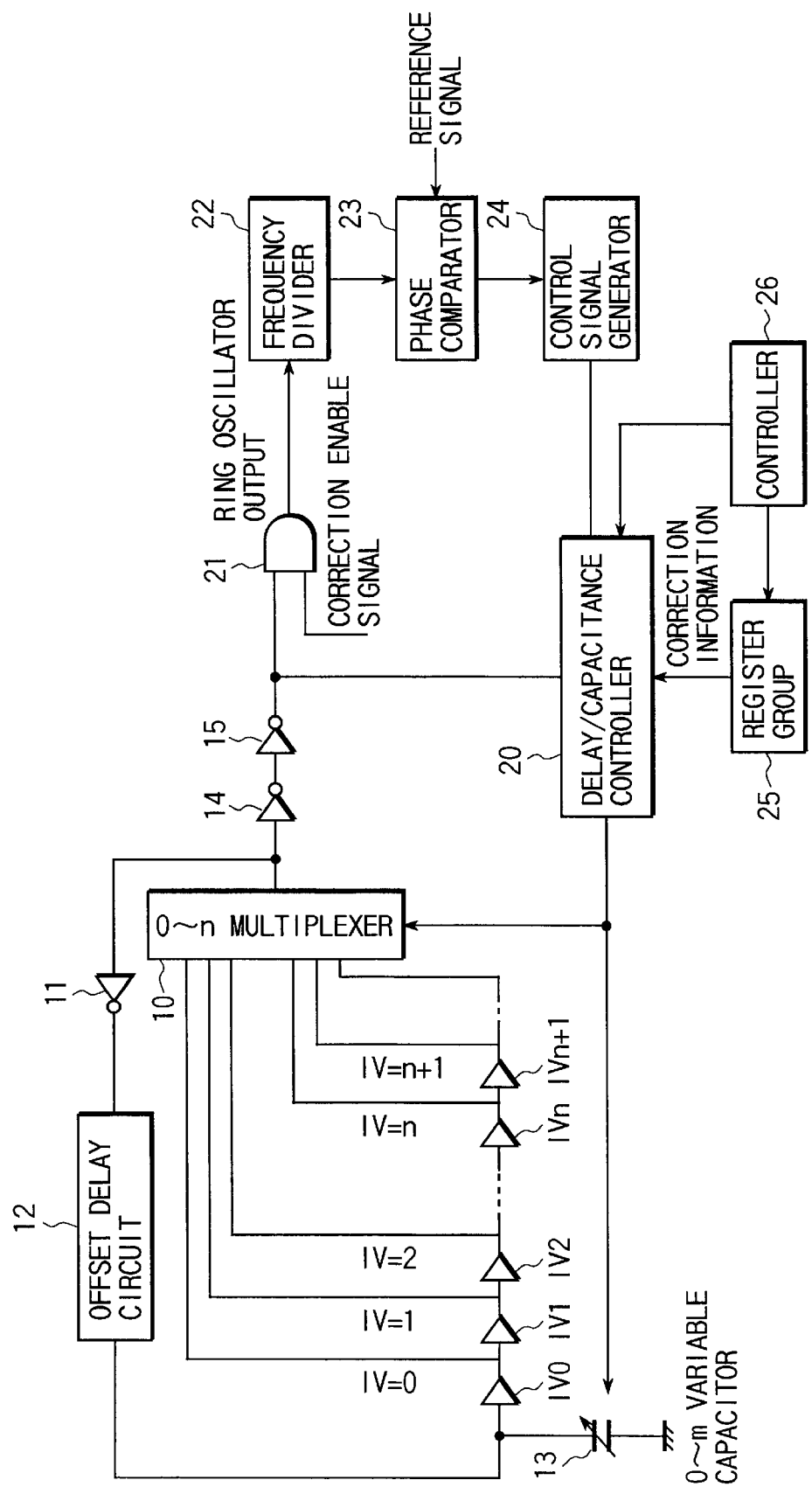
FIG. 1 is a block diagram of a digital PLL circuit according to an embodiment of the present invention.

FIG. 1 shows a digital PLL circuit according to an embodiment of the present invention.

In the PLL circuit, a variable-frequency ring oscillator comprises a plurality of delay circuits IV0 to IVn connected in a multi-stage, a multiplexer 10 for selecting one of the outputs of the delay circuits IV0 to IVn and determining the number of stages of delay circuits, an inverter 11 to which the output signal of the multiplexer 10 is inputted, and an offset delay circuit 12 for outputting a delay signal obtained by delaying the output signal of the inverter 11 for the length of the input offset delay time and feeding back the delay signal as the input to the first stage of the delay circuits IV0 to IVn.

A variable capacitor 13 is connected between the input side node of the first stage of the delay circuits IV0 to IVn and the ground node. In the present embodiment, the variable capacitor 13 is designed to be capable of changing the value of its capacitance by changing the number of unit capacitors connected, for example, in parallel.

The selected stages of the delay circuits IV0 to IVn, multiplexer 10, inverter 11, and offset delay circuit 12 are connected in loop and, together with the variable capacitor 13, constitute a ring oscillator. The order in which the inverter 11 and offset delay circuit 12 are connected is not limited by the order shown in the figure. They have only to function as an inverting delay circuit for not only inverting the output of the multiplexer 10 but also delaying the output signal for a specific length of offset delay time.

Two stages of inverters 14 and 15 are connected to the output of the multiplexer 10. The output signal of the inverter 15 at the latter stage is inputted to not only a delay/capacitance controller 20 but also to one input terminal of a two-input AND circuit 21. A correction enable signal (whose active level is low) is inputted to the other input terminal of the AND circuit 21. The output of the AND circuit 21 is the output of the ring oscillator.

In the digital PLL circuit by a delay element selection scheme using the ring oscillator including the two stages of inverters 14 and 15 and the AND circuit 21 as a VCO, a frequency divider 22 frequency-divides the output of the ring oscillator. Then, a phase comparator 23 compares the frequency-divided output with a phase reference signal. Thereafter, a control signal generator 24 generates a control signal corresponding to the comparison output and inputs the control signal to the delay/capacitance controller 20.

The delay/capacitance controller 20 refers to correction information and generates a control signal for selecting the input to the multiplexer 10 (or determining the number of stages of delay circuits) and controlling the value of capacitance of the variable capacitor 13 (or determining the number of capacitors connected in parallel).

Figure 2:
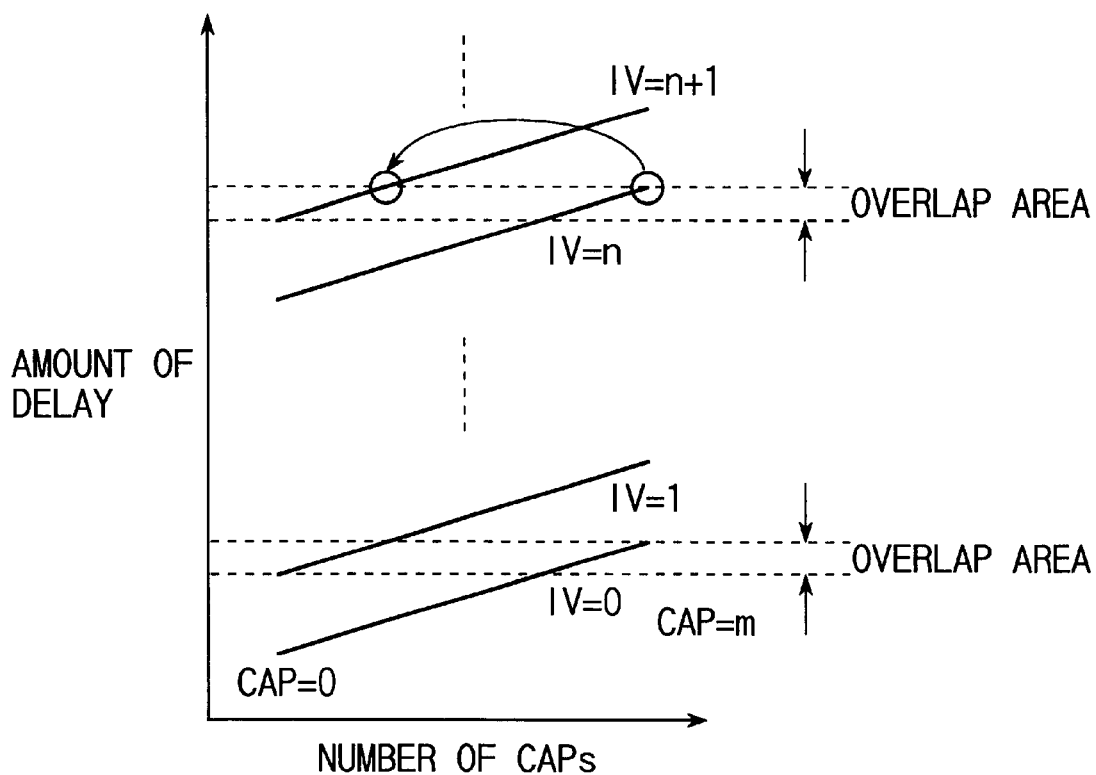
FIG. 2 is a characteristic diagram showing the relationship between the number (IV=0 to n) of stages of delay circuits and the number (CAP=0 to m) of unit capacitors in a variable-frequency ring oscillator in FIG. 1 and the length of delay time.

FIG. 2 shows the relationship (or a delay time characteristic) between the determined number (IV=0 to n) of stages of delay circuits and the number (CAP=0 to m) of unit capacitors in the variable-frequency ring oscillator of FIG. 1 and the length of delay time.

It is seen from FIG. 2 that changing the number of stages of delay circuits causes the length of delay time to vary greatly in digital form and that, when the value of capacitance of the variable capacitor (or the number of capacitors connected) is changed, with the number of stages of delay circuits remaining unchanged, the length of delay time changes almost continuously in a constant range.

In this case, the ring oscillator is designed in advance to cause a certain number of stages of delay circuits and its adjacent number of stages of delay circuits to have an overlap area where the length of delay time at one end of the delay time characteristic of the former overlaps with that at one end of the delay time characteristic of the latter. Specifically, the delay circuit IV and variable capacitor 13 are so constructed in advance that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

On the other hand, a high-speed search algorithm (for example, a binary search) for acquiring correction information to make a jump to the optimum transitional state during the transition of frequency involving the change of the number of stages of delay circuits is incorporated, together with its storage unit (for example, a register group 25) and a controller 26, into the same LSI.

The binary search operation by the algorithm is executed automatically during the time (including the power-on time) when the PLL output need not be supplied, at regular intervals, at an external request, or in the presence of a sense output, such as temperature fluctuations or power fluctuations, as a trigger.

For example, in an LSI strongly required to have less power consumption as a handy phone, the operation of the built-in digital PLL circuit is brought into a sleep mode to reduce the power consumption. During the sleep period (or the time when the PLL output need not be supplied), a correcting operation can be carried out without any trouble.

Specifically, to make such a correction, a gate circuit 21 is inserted which uses a correction enable signal to control the passage of the output signal of the multiplexer 10 as described above. There is further provided a control circuit (having a binary search algorithm) 26 for controlling the delay/capacitance controller 20 during the time when the correction enable signal is at the active level and determining the optimum value of the number of unit capacitors for the variable capacitor because of the transition of the number of stages of delay circuits, on the basis of the output signal of the multiplexer 10.

Figure 3:
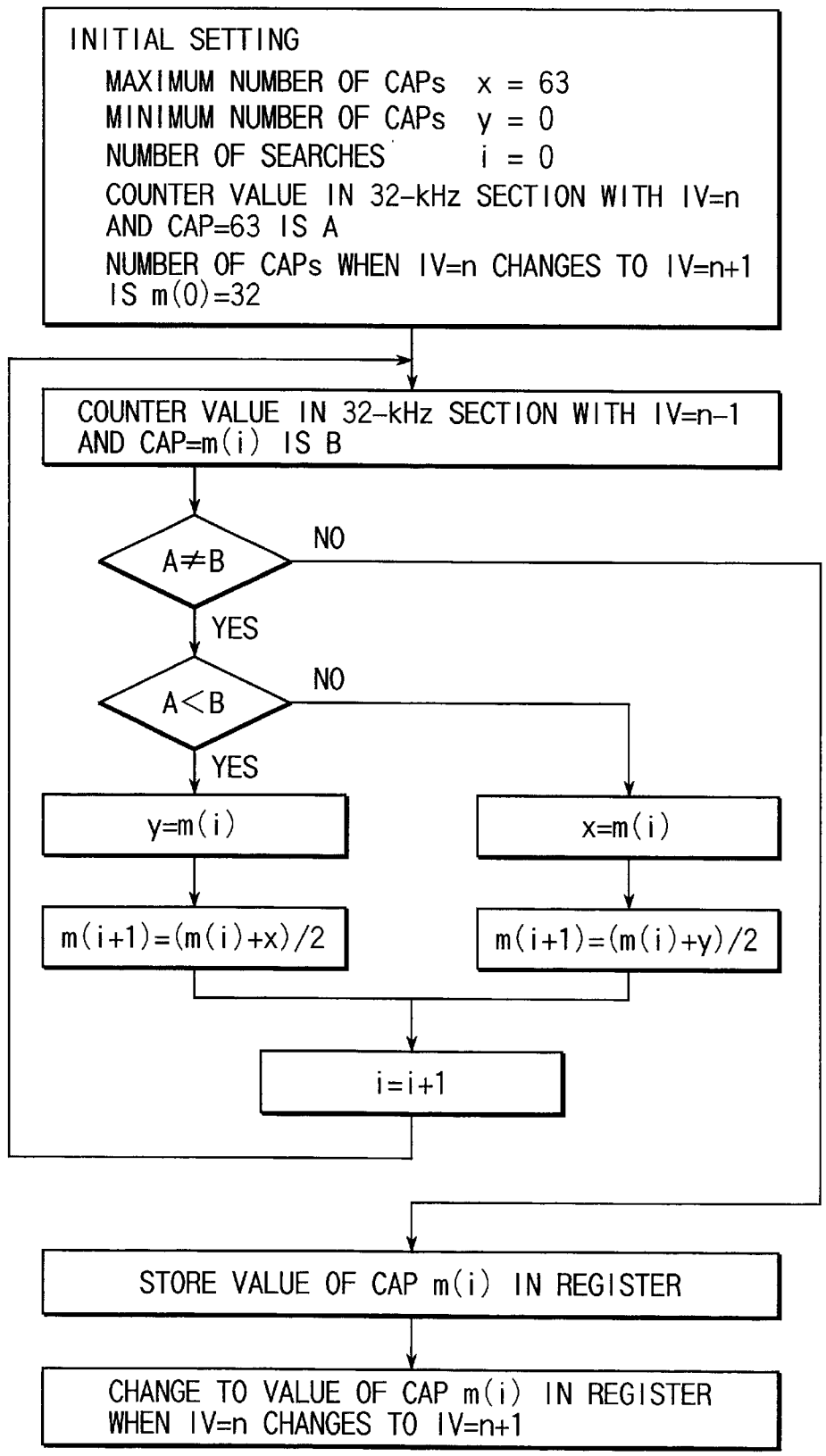
FIG. 3 is a flowchart showing an example of a binary search algorithm for acquiring correction information in the ring oscillator of FIG. 1.

FIG. 3 shows an example of a binary search algorithm for acquiring correction information in the ring oscillator of FIG. 1.

Assume that the initial values are set as follows: the maximum number of unit capacitors for the variable capacitor 13 connected is x=63, the minimum number of unit capacitors for the variable capacitor 13 connected is y=0, the number of corrections (searches) is i=0, the value of the counter counting the PLL output pulses (e.g., 10 megahertz) in a reference clock section (e.g., 32 kilohertz) when the number of stages of delay circuits is n with x=63 is A, and the number of unit capacitors connected (or the number of capacitors) when the number of stages of delay circuits changes from n to n+1 is m and m is a function of i.

Let the initial value m(0) of the number of capacitors when the number of stages of delay circuits changes from n to n+1 be 32 (that is, almost the midpoint value of the maximum value of x). Let the value of the counter counting the PLL output pulses at that time be B. When A=B, since the length of delay time with the number of delay stages n and x=63 is equal to the length of delay time with the number of delay stages=n+1 and x=32, the value of m=32 is stored in a specific register (n).

In contrast, when A<B or B<A, the optimum value m(i) of the number of capacitors that gives A=B is found using a binary search algorithm as shown in FIG. 3 and the value of m(i) is stored in the register (n).

The above-described binary search operation is executed for a case where the number of delay stages is increased after transition and a case where it is decreased after transition, while the number of delay stages is being changed before transition. The optimum value m(i) of the number of capacitors in each of the cases is stored in each register (0 to n+1).

In an actual use, when the state with the number of delay stages=n and x=63 before transition is changed to the state with the number of delay stages=n+1, the storage information in the register (n) is referred to by the delay/capacitance controller 20.

With the above configuration, the frequency of oscillation is roughly adjusted by the number of stages of delay circuits and then finely adjusted by the value of capacitance of the variable capacitor 13 (or the number of capacitors connected), producing the desired output frequency.

Before the number of stages of delay circuits is changed, the optimum value (correction information) of the value of capacitance of the variable capacitor 13 (or the number of unit capacitors connected in parallel) is determined in advance to suppress the occurrence of jitters in the PLL output frequency to a minimum. At the time of the transition of frequency involving the change of the number of stages of delay circuits, the delay/capacitance controller 20 is so controlled for correction that it jumps into the optimum transitional state on the basis of the correction information. For example, as shown in FIG. 2, when the number of stages of delay circuits is changed to its adjacent number of stages of delay circuits, the value of capacitance of the variable capacitor is changed to the optimum value of capacitance at which the corresponding length of delay time in the overlap area is obtained.

With the present invention, when the frequency is in transition as a result of the transition of the number of stages of delay circuits, the delay/capacitance controller 20 controls the multiplexer 10 and the variable capacitor 13 on the basis of the correction information. Because the output frequency of the ring oscillator changes in acquiring the correction information, the two-input AND circuit 21 is inserted on the output side of the multiplexer 10. The output signal of the ring oscillator is inputted to one input terminal of the AND circuit 21 and the correction enable signal (whose active level is low) is inputted to the other input terminal of the AND circuit. This causes the AND circuit 21 to be closed in acquiring the correction information and the output of the AND circuit 2 in a normal operation to be supplied as the output of the ring oscillator.

Consequently, even when there are variation in the manufacture of ring oscillators or variations or fluctuations in the delay characteristic due to other conditions, such as temperature fluctuations or power fluctuations, suitably acquiring the correction information enables the desired correction to be made in changing the frequency, which prevents the occurrence of jitters in the PLL output frequency and the deterioration of the PLL characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A digital PLL circuit comprising:
    a variable-frequency ring oscillator configured to generate an output signal;
    a frequency divider configured to frequency-divide the output signal of said ring oscillator and generate a frequency-divided output signal;
    a phase comparator configured to compare the frequency-divided output signal of said frequency divider with a phase reference signal and generate a comparison output signal;
    a control signal generator configured to generate a control signal corresponding to the comparison output signal of said phase comparator and supply the control signal to said ring oscillator,
    wherein said ring oscillator includes:
        a plurality of delay circuits connected in a multistage,
        a multiplexer configured to select one of output signals of said delay circuits, determine the number of stages of said delay circuits and generate an output signal corresponding to the determined number of stages, an inverting delay circuit configured to invert the output signal of said multiplexer, a variable capacitor including a plurality of capacitor elements selectively connected to chance a value of capacitance, and a control circuit configured to refer to correction information and control said multiplexer for selection of said delay circuits and said variable capacitor for connection of the capacitor elements of said variable capacitor;

a logical gate circuit which is connected to an output of said multiplexer and controls a passage of the output signal of the multiplexer according to a correction enable signal; and a correction information creating circuit which controls said control circuit during a time when the correction enable signal is at an active level and which, on the basis of the output signal of said multiplexer, determines an optimum value of the number of capacitors connected for the variable capacitor in association with change of the number of stages of delay circuits and creates said correction information.

2. A digital PLL circuit comprising:

a variable-frequency ring oscillator configured to generate an output signal;

a frequency divider configured to frequency-divide the output signal of said ring oscillator and generate a frequency-divided output signal;

a phase comparator configured to compare the frequency-divided output signal of said frequency divider with a phase reference signal and generate a comparison output signal; and a control signal generator configured to generate a control signal corresponding to the comparison output signal of said phase comparator and supply the control signal to said ring oscillator, wherein said ring oscillator includes:

a plurality of delay circuits connected in a multistage, a multiplexer configured to select one of output signals of said delay circuits, determine the number of stages of said delay circuits and generate an output signal corresponding to the determined number of stages, an inverting delay circuit configured to invert the output signal of said multiplexer, a variable capacitor including a plurality of capacitor elements selectively connected to change a value of capacitance, and a control circuit configured to refer to correction information and control said multiplexer for selection of said delay circuits and said variable capacitor for connection of the capacitor elements of said variable capacitor, and wherein the correction information indicates an optimum number of capacitor elements obtained during shifting from the stage of the delay circuits before the transient to the stage of the delay circuits after the transient.

3. A digital PLL circuit comprising:

a variable-frequency ring oscillator configured to generate an output signal;

a frequency divider configured to frequency-divide the output signal of said ring oscillator and generate a frequency-divided output signal;

a phase comparator configured to compare the frequency-divided output signal of said frequency divider with a phase reference signal and generate a comparison output signal; and a control signal generator configured to generate a control signal corresponding to the comparison output signal of said phase comparator and supply the control signal to said ring oscillator, wherein said ring oscillator includes:

a plurality of delay circuits connected in a multistage, a multiplexer configured to select one of output signals of said delay circuits, determine the number of stages of said delay circuits and generate an output signal corresponding to the determined number of stages, an inverting delay circuit configured to invert the output signal of said multiplexer, a variable capacitor including a plurality of capacitor elements selectively connected to change a value of capacitance, and a control circuit configured to refer to correction information and control said multiplexer for selection of said delay circuits and said variable capacitor for connection of the capacitor elements of said variable capacitor, and wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

4. A digital PLL circuit comprising:

a variable-frequency ring oscillator configured to generate an output signal;

a frequency divider configured to frequency-divide the output signal of said ring oscillator and generate a frequency-divided output signal;

a phase comparator configured to compare the frequency-divided output signal of said frequency divider with a phase reference signal and generate a comparison output signal; and a control signal generator configured to generate a control signal corresponding to the comparison output signal of said Phase comparator and supply the control signal to said ring oscillator, wherein said ring oscillator includes:

a plurality of delay circuits connected in a multistage, a multiplexer configured to select one of output signals of said delay circuits, determine the number of stages of said delay circuits and generate an output signal corresponding to the determined number of stages, an inverting delay circuit configured to invert the output signal of said multiplexer, a variable capacitor including a plurality of capacitor elements selectively connected to change a value of capacitance, and a control circuit configured to refer to correction information and control said multiplexer for selection of said delay circuits and said variable capacitor for connection of the capacitor elements of said variable capacitor, and wherein said delay circuits are so constructed that a certain number of stages of delay circuits selected by said multiplexer and its adjacent number of stages of delay circuits have an overlap area where the length of d the delay time characteristic of the former overlaps with the length of delay time in the delay time characteristic of the latter.

5. The digital PLL circuit according to claim 4, wherein the correction information indicates an optimum number of capacitor elements obtained during shifting from the stage of the delay circuits before the transient to the stage of the delay circuits after the transient.

6. The digital PLL circuit according to claim 4, wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

7. The digital PLL circuit according to claim 4, further comprising a logical gate circuit which is connected to an output of said multiplexer and controls a passage of the output signal of the multiplexer according to a correction enable signal, and a correction information creating circuit which controls said control circuit during a time when said correction enable signal is at an active level and which, on the basis of the output signal of said multiplexer, determines an optimum value of the number of capacitors connected for the variable capacitor in association with change of the number of stages of delay circuits and creates said correction information.

8. The digital PLL circuit according to claim 7, wherein said control circuit executes processing automatically during a time when the PLL output need not be supplied, at regular intervals, at an external request, or in response to a sense output corresponding to temperature fluctuations or power fluctuations.

9. The digital PLL circuit according to claim 7, wherein the correction information indicates an optimum number of capacitor elements obtained during shifting from the stage of the delay circuits before the transient to the stage of the delay circuits after the transient.

10. The digital PLL circuit according to claim 7, wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

11. The digital PLL circuit according to claim 7, wherein said control circuit has a binary search algorithm and is provided on the same integrated circuit chip where the PLL circuit is.

12. The digital PLL circuit according to claim 11, wherein said control circuit executes processing automatically during the time when the PLL output need not be supplied, at regular intervals, at an external request, or in response to a sense output corresponding to temperature fluctuations or power fluctuations.

13. The digital PLL circuit according to claim 12, wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

14. The digital PLL circuit according to claim 11, wherein said control circuit executes processing automatically during the time when the PLL output need not be supplied, at regular intervals, at an external request, or in response to a sense output corresponding to temperature fluctuations or power fluctuations, as a trigger.

15. The digital PLL circuit according to claim 14, wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

16. The digital PLL circuit according to claim 14, wherein the correction information indicates an optimum number of capacitor elements obtained during shifting from the stage of the delay circuits before the transient to the stage of the delay circuits after the transient.

17. The digital PLL circuit according to claim 16, wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

18. A digital PLL circuit comprising:
a ring oscillator comprising a plurality of delay circuits connected in a multistage, a multiplexer configured to select one of output signals of said delay circuits and determine the number of stages of said delay circuits, a first inverter circuit receiving an output signal of said multiplexer, an offset delay circuit configured to output a delay signal obtained by delaying the output signal of said first inverter circuit by an offset delay time and feed back the delay signal to a first stage circuit of said delay circuits, a variable capacitor connected between an input node of said first stage circuit and a ground node, a second inverter circuit connected to an output of said multiplexer, and a logical gate connected to an output of said second inverter circuit and configured to respond to an external correction enable signal;
a control circuit connected to an output of said second inverter circuit and configured to control the number of stages of the delay circuits and a capacitance value of said variable capacitor;
a frequency divider circuit configured to frequency-divide an output signal of said ring oscillator;
a phase comparator circuit configured to compare a frequency-divided signal of said frequency divider circuit with a phase reference signal; and
a control signal generator circuit configured to generate a control signal corresponding to a phase comparison output signal of said phase comparator circuit and input it to said control circuit.

19. The digital PLL circuit according to claim 18, wherein said delay circuits and said variable capacitor are so constructed that the length of delay time when the value of capacitance of the variable capacitor is brought close to the maximum value at a certain number of stages of delay circuits overlaps with the length of delay time when the value of capacitance of the variable capacitor is brought close to the minimum value in a case where the number of stages of delay circuits is increased by one.

\* \* \* \* \*

UNITED STATES PATENT AND TRADEMARK OFFICE
CERTIFICATE OF CORRECTION

PATENT NO. : 6,687,321 B1
DATED : February 3, 2004
INVENTOR(S) : Kada et al.

It is certified that error appears in the above-identified patent and that said Letters Patent is hereby corrected as shown below:

Column 7,
Line 6, change "chance" to -- change --

Column 8,
Line 45, change "Phase" to -- phase --.
Line 67, change "d the" to -- delay time in the --.

Column 9,
Line 56, change "claim 12" to -- claim 11 --.

Signed and Sealed this

Sixth Day of April, 2004

JON W. DUDAS
*Acting Director of the United States Patent and Trademark Office*